United States Patent
Lee

(10) Patent No.: US 11,862,575 B2
(45) Date of Patent: Jan. 2, 2024

(54) SEMICONDUCTOR DEVICE HAVING A CRACK DETECTION RING AND A CRACK DETECTION STRUCTURE

(71) Applicant: SK hynix Inc., Gyeonggi-do (KR)

(72) Inventor: Sung Ryong Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 108 days.

(21) Appl. No.: 17/392,054

(22) Filed: Aug. 2, 2021

(65) Prior Publication Data

US 2022/0293532 A1 Sep. 15, 2022

(30) Foreign Application Priority Data

Mar. 15, 2021 (KR) .................... 10-2021-0033175

(51) Int. Cl.
*H01L 23/00* (2006.01)
*H01L 23/522* (2006.01)
*H01L 23/58* (2006.01)

(52) U.S. Cl.
CPC ........ *H01L 23/562* (2013.01); *H01L 23/5226* (2013.01); *H01L 23/585* (2013.01)

(58) Field of Classification Search
CPC . H01L 23/562; H01L 23/5226; H01L 23/585; H01L 22/34; H01L 22/12; H01L 22/14; H01L 22/20
See application file for complete search history.

(56) References Cited

U.S. PATENT DOCUMENTS

| | | | | |
|---|---|---|---|---|
| 9,741,667 | B2* | 8/2017 | Zeng | ........................ H01L 22/34 |
| 9,847,301 | B2* | 12/2017 | Minami | ................. H10B 41/00 |
| 10,147,657 | B2 | 12/2018 | Ilkov | |
| 10,629,546 | B2* | 4/2020 | Roh | ...................... H01L 23/562 |
| 11,105,846 | B1* | 8/2021 | Polomoff | ........... G01R 31/2884 |
| 2007/0069365 | A1 | 3/2007 | Archer et al. | |
| 2008/0035923 | A1 | 2/2008 | Tschmelitsch et al. | |
| 2018/0364303 | A1 | 12/2018 | werhane et al. | |
| 2021/0074596 | A1* | 3/2021 | Kim | ........................ H10B 43/10 |

FOREIGN PATENT DOCUMENTS

| | | |
|---|---|---|
| KR | 10-2010-0128105 A | 12/2010 |
| KR | 10-2017-0051085 A | 5/2017 |
| KR | 10-2017-0122141 A | 11/2017 |
| KR | 10-2020-0032470 A | 3/2020 |

* cited by examiner

*Primary Examiner* — Dao H Nguyen
(74) *Attorney, Agent, or Firm* — IP & T GROUP LLP

(57) ABSTRACT

A semiconductor device includes a crack detection ring and a crack detection structure. The semiconductor device comprises a first seal-ring surrounding a circuit region; a crack detection ring surrounding the first seal-ring; a second seal-ring surrounding the first seal-ring and the crack detection ring; a connection part connecting the first seal-ring and the crack detection ring; and a crack detection structure disposed in the circuit region and electrically connected to the crack detection ring.

20 Claims, 18 Drawing Sheets

SEMICONDUCTOR DEVICE HAVING A CRACK DETECTION RING AND A CRACK DETECTION STRUCTURE

CROSS-REFERENCE TO RELATED APPLICATIONS

The present application claims priority to Korean Patent Application No. 10-2021-0033175, filed on Mar. 15, 2021, which is herein incorporated by reference in its entirety.

BACKGROUND

1. Field

The present patent document relates to a semiconductor device, and, more particularly, to a semiconductor device including a crack detection ring and a crack detection structure.

2. Description of the Related Art

As semiconductor devices are more densely integrated, issues such as a crack or peeling problem resulting from a sawing process or external forces are being recognized. Preventing a crack or a peeling in a semiconductor device and tracking a location of a crack or a peeling are important factors in a semiconductor fabrication process for improving productivity and lowering the cost.

SUMMARY

Various embodiments of the present invention provide a semiconductor device including a crack detection ring and a crack detection structure.

According to one embodiment of the present invention, a semiconductor device may comprise: a first seal-ring surrounding a circuit region; a crack detection ring surrounding the first seal-ring; a second seal-ring surrounding the first seal-ring and the crack detection ring; a connection part connecting the first seal-ring and the crack detection ring; and a crack detection structure disposed in the circuit region and electrically connected to the crack detection ring.

According to another embodiment of the present invention, a semiconductor device may comprise: a first seal-ring surrounding a circuit region; a crack detection ring surrounding the first seal-ring; a second seal-ring surrounding the first seal-ring and the crack detection ring; and a plurality of controllers and a plurality of operators disposed inside the circuit region and electrically connected to the crack detection ring; wherein the plurality of controllers provides a current or a voltage to the crack detection ring and the plurality of operators includes a comparator that compares the current or the voltage, which passed through the crack detection ring, with a reference current or a reference voltage, respectively.

According to various embodiments of the present invention, a crack or a peeling may be prevented from propagating, and a location where a crack or a peeling occurs may be estimated relatively accurately. Accordingly, the productivity of the semiconductor device may increase and the manufacturing cost may be lowered.

DETAILED DESCRIPTION

Figure 1:
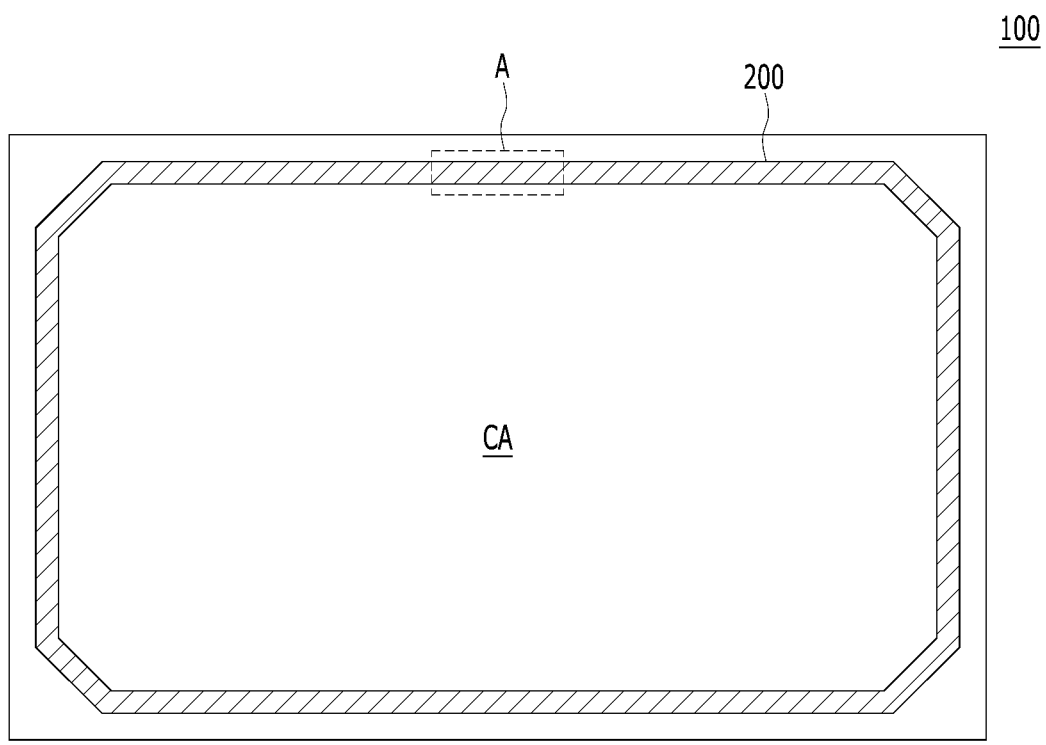
FIG. 1 is a top view illustrating a seal-ring structure of a semiconductor device according to one embodiment of the present disclosure.

FIG. 1 is a top view illustrating a seal-ring structure 200 of a semiconductor device 100 according to one embodiment of the present disclosure. Referring to FIG. 1, the semiconductor device 100 according to this embodiment of the present disclosure may include the seal-ring structure 200 surrounding a circuit region CA in for example but not limited to a frame shape. The seal-ring structure 200 may in general have a closed loop shape disposed close to the edges of the semiconductor device 100. Corner portions of the seal-ring structure 200 may have a chamfered shape. The seal-ring structure 200 may have a function of preventing and detecting a crack or a peeling of the semiconductor device 100.

Figure 2:
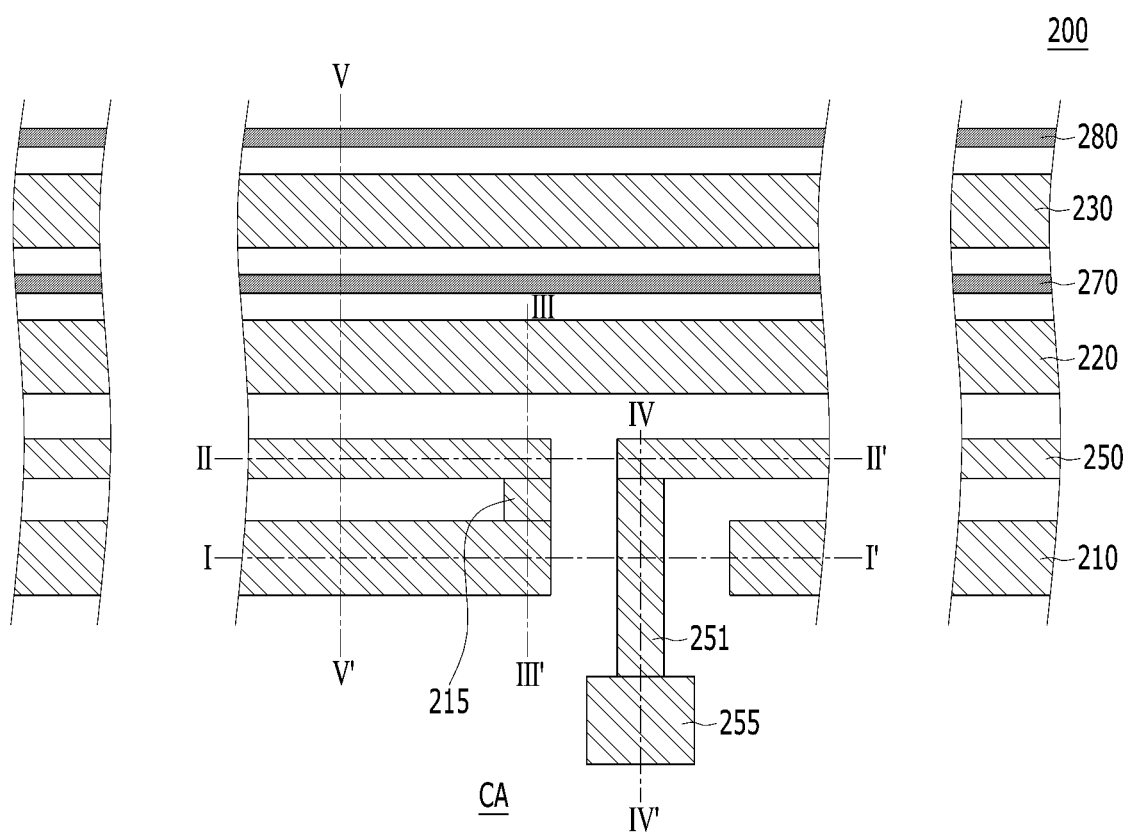
FIG. 2 is an enlarged top view of region A of FIG. 1.

FIG. 2 is an enlarged top view of region A of FIG. 1. Referring to FIG. 2, the seal-ring structure 200 according to one embodiment of the present disclosure includes an inner seal-ring 210 surrounding the circuit region CA, an intermediate seal-ring 220, and an outer seal-ring 230, a crack detection ring 250, an inner trench ring 270, and an outer trench ring 280. The crack detection ring 250 may surround the inner seal-ring 210, the intermediate seal-ring 220 may surround the crack detection ring 250, the inner trench ring 270 may surround the intermediate seal-ring 220, the outer seal-ring 230 may surround the inner trench ring 270, and the outer trench ring 280 may surround the outer seal-ring 230. For example, the crack detection ring 250 may be disposed between the inner seal-ring 210 and the intermediate seal-ring 220.

The inner seal-ring 210, the intermediate seal-ring 220, the outer seal-ring 230, the inner trench ring 270, and the outer trench ring 280 may have a closed loop structure. The crack detection ring 250 may be an open loop structure. In other embodiments, the intermediate seal-ring 220, the outer seal-ring 230, the inner trench ring 270, and the outer trench ring 280 may be optionally omitted.

The seal-ring structure 200 may further include a connection part 215. The connection part 215 may electrically connect a first end of the crack detection ring 250 to the inner seal-ring 210. In another embodiment, the first end of the crack detection ring 250 may be electrically connected to the intermediate seal-ring 220. That is, the connection part 215 may electrically connect the first end of the crack detection ring 250 to the intermediate seal-ring 220. In another embodiment, the first end of the crack detection ring 250 may be electrically connected to both the inner seal-ring 210 and the intermediate seal-ring 220.

The seal-ring structure 200 may further include an extension part 251 and an input pad 255 as a structure for detecting a crack. A second end of the crack detection ring 250 may be connected to the input pad 255 through the extension part 251. The extension part 251 may cross the inner seal-ring 210. The extension part 251 and the inner seal-ring 210 may be not directly connected. The input pad 255 may be disposed in the circuit region CA. Voltage or current may be provided from the input pad 255 to the crack detection ring 250 through the extension part 251. The voltage or current passing through the crack detection ring 250 may be provided to the inner seal-ring 210 or to the intermediate seal-ring 220 through the connection part 215. The voltage or current passing through the inner seal-ring 210 or the intermediate seal-ring 220 may be grounded.

Figure 3:
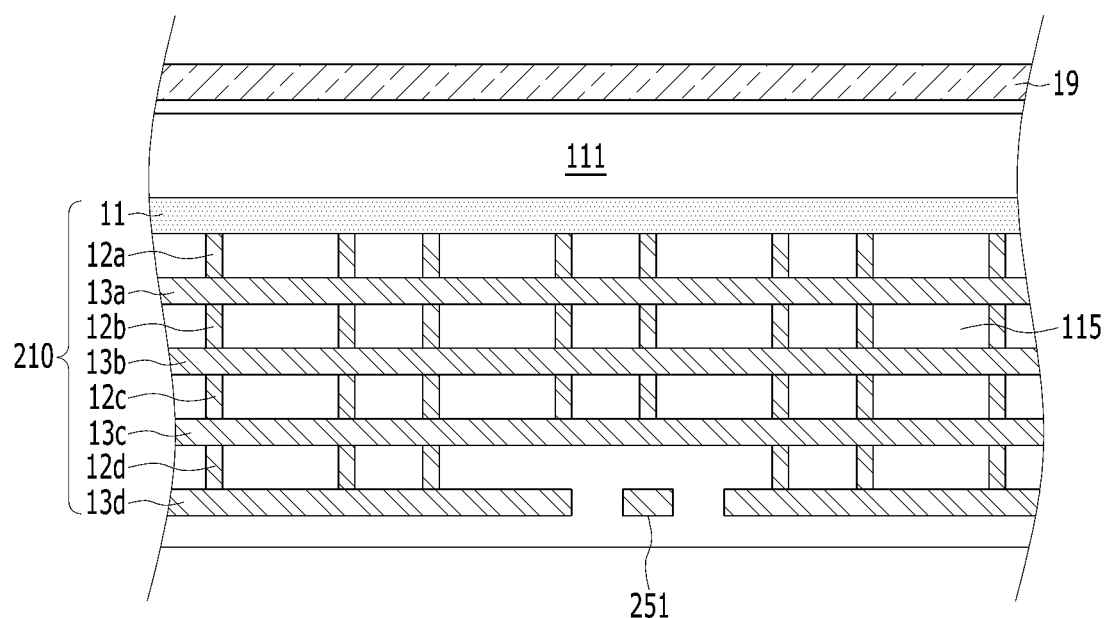
FIG. 3 is a longitudinal cross-sectional view taken along line I-I' of FIG. 2.

FIG. 3 is a longitudinal cross-sectional view taken along line I-I' of FIG. 2. Referring to FIG. 3, the inner seal-ring 210 according to one embodiment of the present disclosure may include an inner doped region 11, a multilayer of inner via patterns 12a to 12d, and a multilayer of inner wiring patterns 13a to 13d. The inner doped region 11 may be formed in an upper substrate 111. The upper substrate 111 may include a monocrystalline silicon layer. In one embodiment, the upper substrate 111 may be a silicon layer on which a photodiode of an image sensor is formed. The inner doped region 11 may include N-type ions or P-type ions. The inner doped region 11 may be formed at the same level as a common source region of the image sensor.

The inner wiring patterns 13a to 13d formed in the upper interlayer insulating layer 115 formed on a surface of the upper substrate 111 may be disposed to extend parallel to each other in a horizontal direction. The inner via patterns 12a to 12d may extend parallel to each other in a vertical direction so as to electrically connect the inner wiring patterns 13a to 13d to each other. The inner via patterns 12a to 12d may include first to fourth inner via patterns 12a to 12d which are vertically aligned, and the inner wiring patterns 13a to 13d may include first to fourth inner wiring patterns 13a to 13d. Each of the inner via patterns 12a to 12d and the inner wiring patterns 13a to 13d may include metal.

The inner doped region 11 and the inner wiring patterns 13a to 13d may extend in a horizontal direction in the shape of a parallel rail or lines. The inner doped region 11, the inner via patterns 12a to 12d, and the inner wiring patterns 13a to 13d may form a mesh shape. The inner seal-ring 210 may be surrounded with the upper interlayer insulating layer 115. The upper interlayer insulating layer 115 may include an insulating material such as silicon oxide or silicon nitride.

In one embodiment, the semiconductor device 100 may further include an inner grid wiring 19. The inner grid wiring 19 may be disposed on an upper surface of the semiconductor device 100, for example, on an upper surface of the upper substrate 111. The inner grid wiring 19 may be parallel to the inner seal-ring 210. For example, the inner grid wiring 19 and the inner seal-ring 210 may vertically overlap. The inner grid wiring 19 may include the same material as a grid pattern dividing unit pixels of an image sensor device. The inner grid wiring 19 and the grid pattern may be formed at the same level.

Some of the fourth inner via patterns 12d and the fourth inner wiring patterns 13d may be omitted so that the extension part 251 may be disposed.

Figure 4:
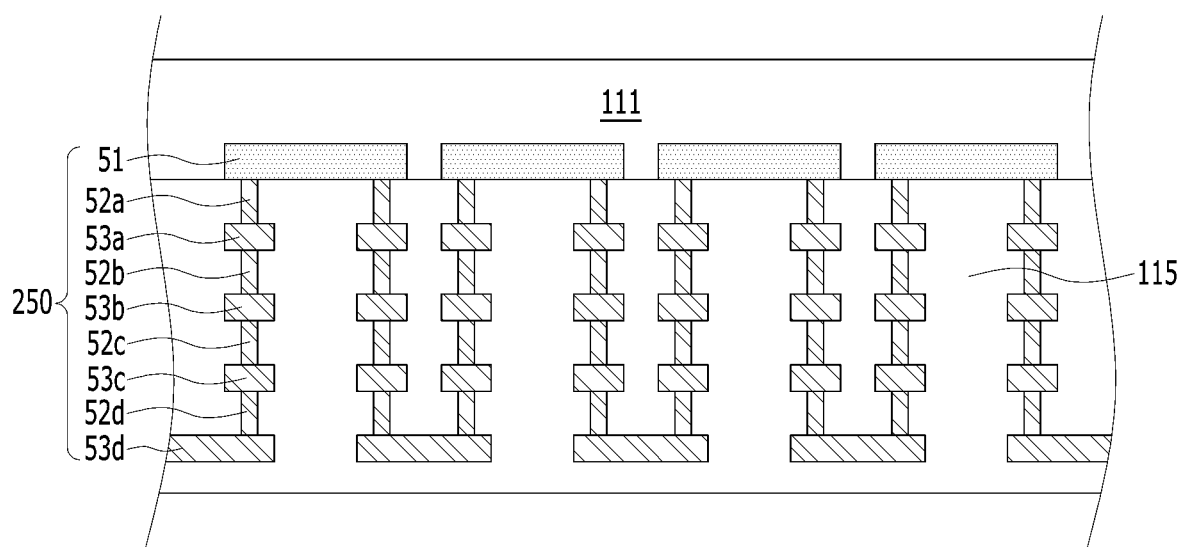
FIG. 4 is a longitudinal cross-sectional view taken along line II-II' of FIG. 2.

FIG. 4 is a longitudinal cross-sectional view taken along line II-II' of FIG. 2. Referring to FIG. 4, the crack detection ring 250 according to one embodiment of the present disclosure may have a serpentine concatenate. The crack detection ring 250 may include a crack detection doped region 51, crack detection via patterns 52a to 52d, and crack detection pad patterns 53a to 53d. The crack detection doped region 51 may be formed in the upper substrate 111. The crack detection doped region 51 may include N-type ions or P-type ions. For example, the crack detection via patterns 52a to 52d may include first to fourth crack detection via patterns 52a to 52d which are vertically aligned. The crack detection pad patterns 53a to 53d may include first to fourth crack detection pad patterns 53a to 53d. The crack detection via patterns 52a to 52d and the crack detection pad patterns 53a to 53d may each include a metal.

The crack detection via patterns 52a to 52d and the crack detection pad patterns 53a to 53d may provide a vertical and electrical connection. The crack detection doped regions 51 and the fourth crack detection pad pattern 53d at the lowermost level among the crack detection pad patterns 53a to 53d may provide horizontal electrical connection.

Each of the crack detection doped regions 51 may horizontally and electrically connect two adjacent first crack detection via patterns 52a. Each of the fourth crack detection pad patterns 53d spaced apart from the upper substrate 111 may horizontally and electrically connect two adjacent fourth crack detection via patterns 52d.

For example, each of the first crack detection via patterns 52a may vertically and electrically connect the crack detection doped region 51 to the first crack detection pad pattern 53a. Each of the second crack detection via patterns 52b may vertically and electrically connect the first crack detection pad pattern 53a to the second crack detection pad pattern 53b. Each of the third crack detection via patterns 52c may vertically and electrically connect the second crack detection pad pattern 53b to the third crack detection pad pattern 53c. Each of the fourth crack detection via patterns 52d may vertically and electrically connect the third crack detection pad pattern 53c to the fourth crack detection pad pattern 53d. In another embodiment, the number of the crack detection via patterns 52a to 52d and the crack detection pad patterns 53a to 53d may be greater than the number illustrated in the drawings.

The crack detection via patterns 52a to 52d and the crack detection pad patterns 53a to 53d may be filled with the upper interlayer insulating layer 115. Since the crack detection ring 250 can have an open loop structure, the fourth crack detection pad patterns 53d may not horizontally connect the adjacent fourth crack detection via patterns 52d in some regions. In another embodiment, the crack detection doped region 51 may not horizontally connect adjacent first crack detection via patterns 52a in some regions.

FIGS. 5A to 5E are longitudinal cross-sectional views taken along line III-III' of FIG. 2. Referring to FIGS. 5A to 5E, the seal-ring structure 200 according to one embodiment of the present disclosure may include an inner seal-ring 210, an intermediate seal-ring 220, and a crack detection ring 250. As described above, the inner seal-ring 210 may include an inner doped region 11, inner via patterns 12a to 12d, and inner wiring patterns 13a to 13d. The intermediate seal-ring 220 may include an intermediate doped region 21, intermediate via patterns 22a to 22d, and intermediate wiring patterns 23a to 23d. A plurality of intermediate via patterns 22a to 22d may be disposed at the same level, respectively. The plurality of intermediate via patterns 22a to 22d may be commonly connected to the same intermediate wiring patterns 23a to 23d disposed at the upper and lower portions, respectively.

The inner via patterns 12a to 12d and the intermediate via patterns 22a to 22d may form a plurality of multi-level pillar shapes. The inner wiring patterns 13a to 13d and the intermediate wiring patterns 23a to 23d may form a plurality of multi-level bar shapes parallel to a horizontal direction. Accordingly, in a top view, the inner via patterns 12a to 12d and the intermediate via patterns 22a to 22d may have the shape of islands arranged in a lattice structure, and the inner wiring patterns 13a to 13d and the intermediate wiring patterns 23a to 23d may have a long stripe or beltway shape.

Figure 5A:
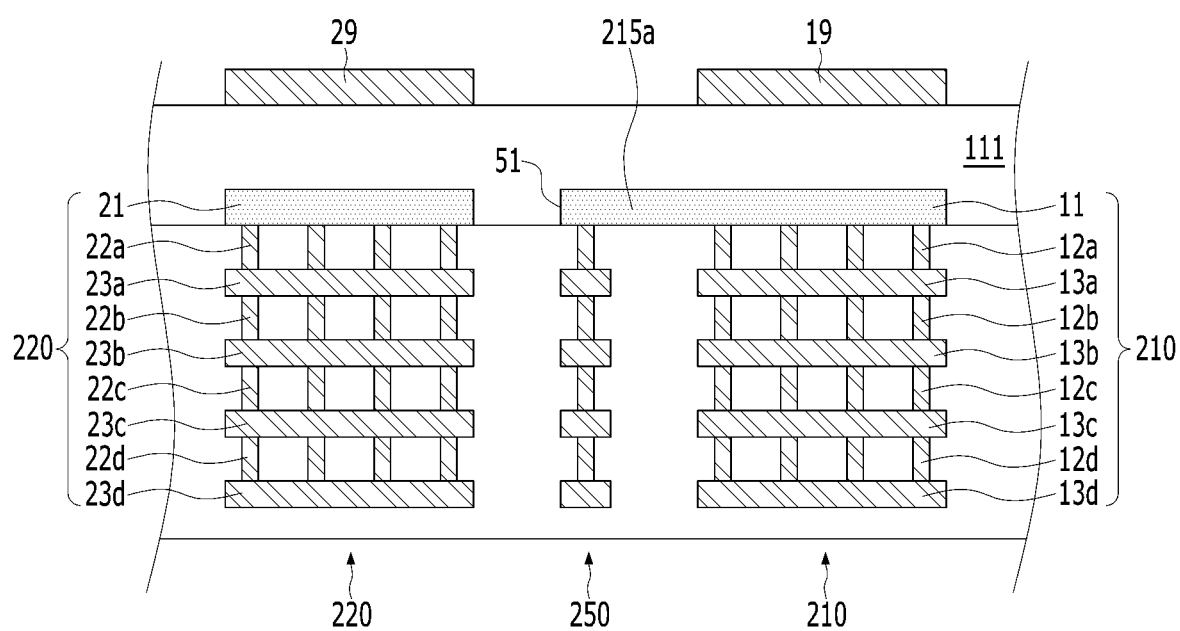
FIGS. 5A to 5E are longitudinal cross-sectional views taken along line III-III' of FIG. 2.

Referring to FIG. 5A, the inner doped region 11 and the crack detection doped region 51 may be electrically connected. For example, the connection part 215a may electrically connect the inner doped region 11 and the crack detection doped region 51. In another embodiment, the connection part 215a may be omitted. For example, the inner doped region 11 and the crack detection doped region 51 may be electrically connected through the upper substrate 111.

Figure 5B:
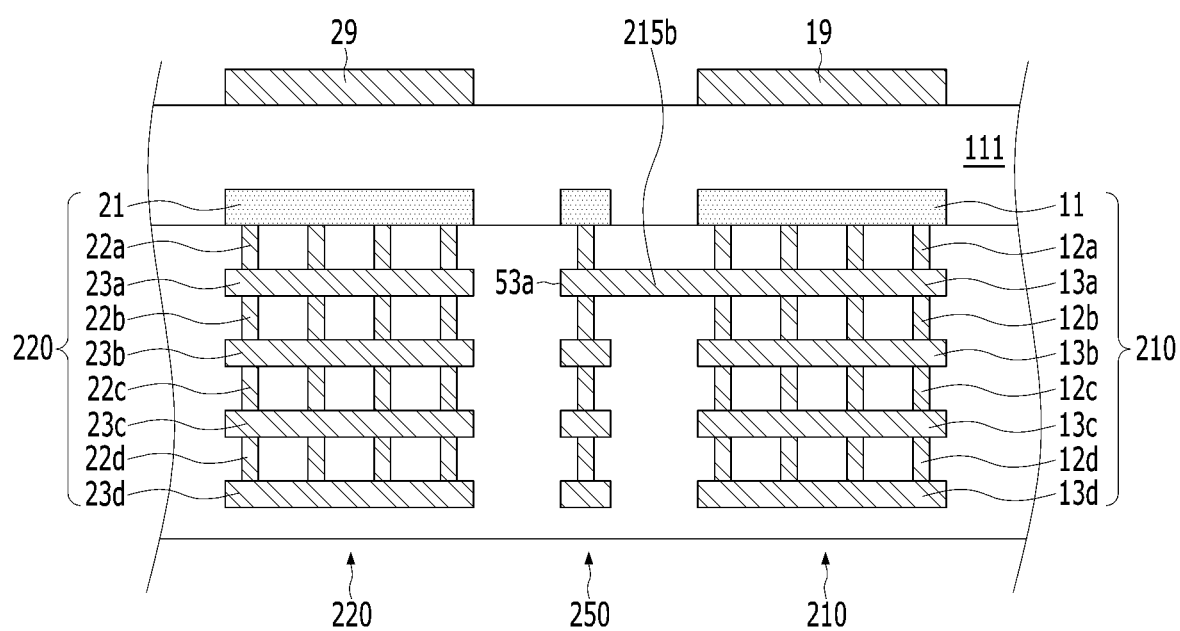

Referring to FIG. 5B, the first inner wiring pattern 13a and the first crack detection pad pattern 53a may be electrically connected. For example, the connection part 215b may electrically connect the first inner wiring pattern 13a and the first crack detection pad pattern 53a.

Figure 5C:
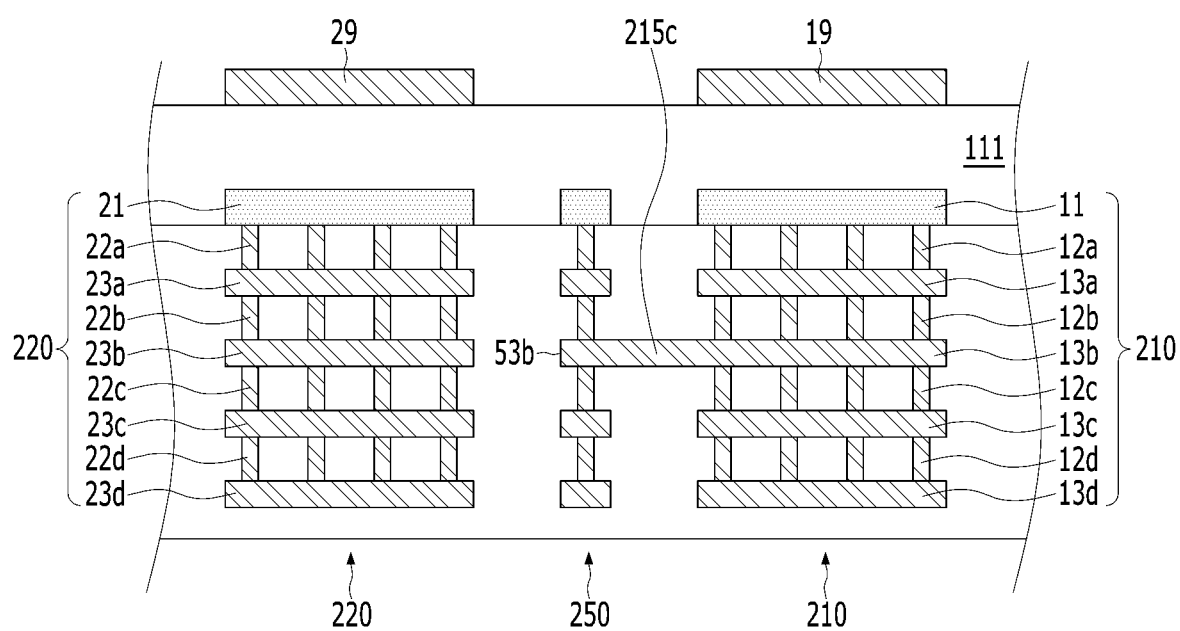

Referring to FIG. 5C, the second inner wiring pattern 13b and the second crack detection pad pattern 53b may be electrically connected. For example, the connection part 215c may electrically connect the second inner wiring pattern 13b and the second crack detection pad pattern 53b.

Figure 5D:
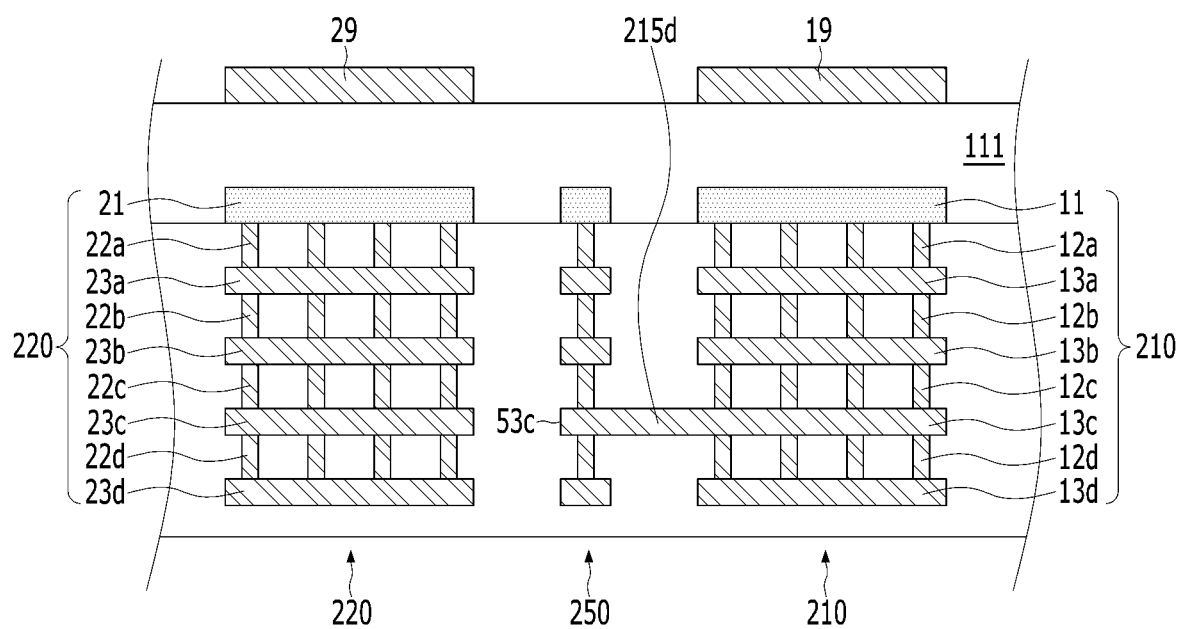

Referring to FIG. 5D, the third inner wiring pattern 13c and the third crack detection pad pattern 53c may be electrically connected. For example, the connection part 215d may electrically connect the third inner wiring pattern 13c and the third crack detection pad pattern 53c.

Figure 5E:
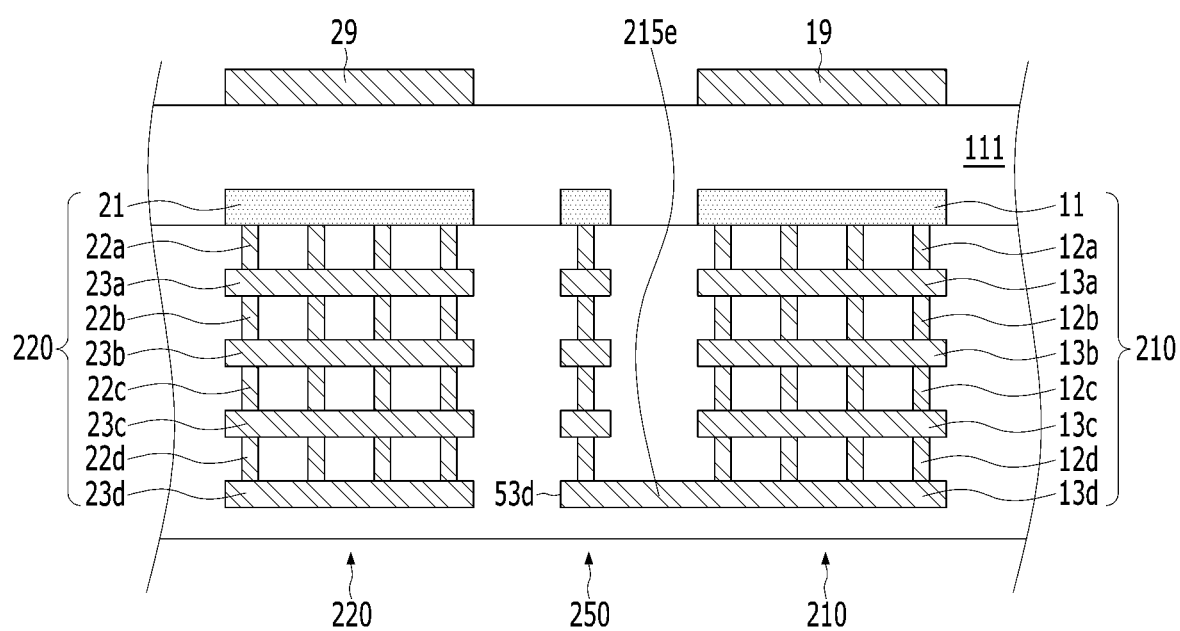

Referring to FIG. 5E, the fourth inner wiring pattern 13d and the fourth crack detection pad pattern 53d may be electrically connected. For example, the connection part 215e may electrically connect the fourth inner wiring pattern 13d and the fourth crack detection pad pattern 53d.

The inventive concepts of the present disclosure illustrated in FIGS. 5A to 5E may be applied exclusively or selectively. In one embodiment, two or more technical features of the present disclosure shown in FIGS. 5A to 5E may be combined. As mentioned above, in other embodiments, the first to fourth intermediate wiring patterns 23a to 23d may be selectively and electrically connected to the first to fourth crack detection pad patterns 53a to 53d, respectively.

Figure 6:
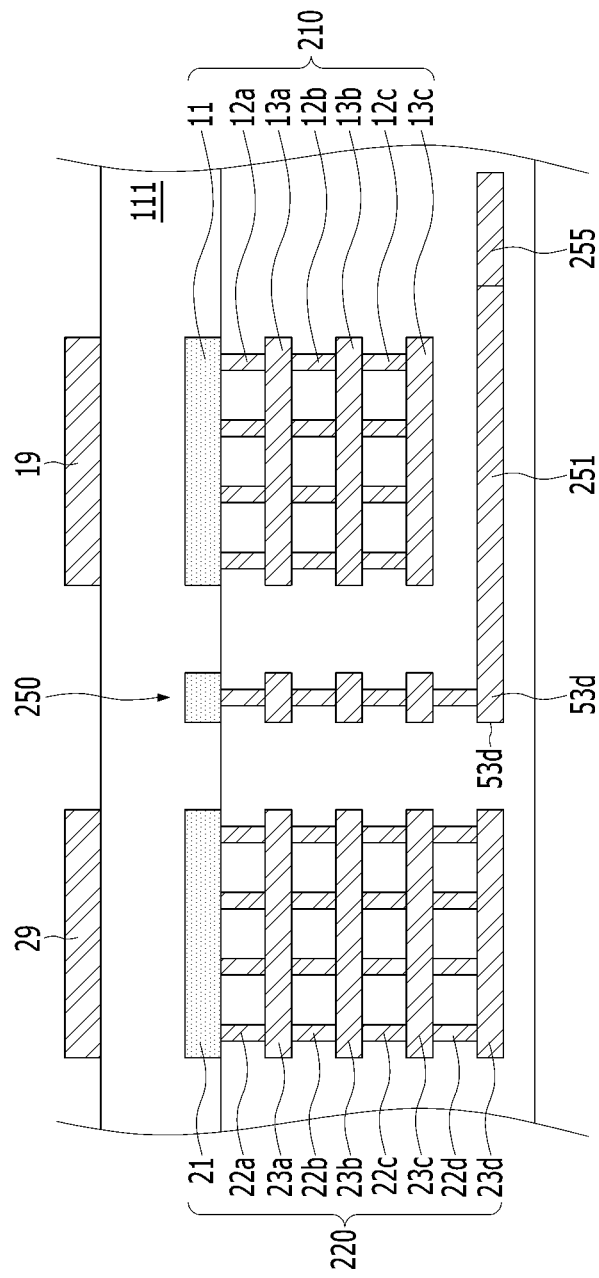
FIG. 6 is a longitudinal cross-sectional view taken along line IV-IV' of FIG. 2.

FIG. 6 is a longitudinal cross-sectional view taken along line IV-IV' of FIG. 2. Referring to FIG. 6, the crack detection ring 250 according to one embodiment of the present disclosure may be electrically connected to the input pad 255. For example, the fourth crack detection pad pattern 53d and the input pad 255 may be connected through the extension part 251. In some areas, the fourth inner via patterns 12d and the fourth inner wiring patterns 13d of the inner seal-ring 210 may be partially removed for the extension part 251. Referring to FIGS. 1 to 6, the voltage or current provided from the input pad 255 may be provided to the upper substrate 111 through the crack detection ring 250 and the inner seal-ring 210 and may be grounded through the upper substrate 111. Accordingly, a crack or peeling of the semiconductor device 100 may be detected by measuring the voltage or current discharged from the input pad 255 to the upper substrate 111. When a crack or a peel in the semiconductor device 100 occurs, a current supplied to the semiconductor device 100 has to flow around the cracked or peeled area disrupting the voltage distributions from a non-cracked or non-peeled structure. Deviations of the measured voltage distributions from a normal condition (i.e., that is deviations from a non-cracked or non-peeled structure) provide a way to detect the presence of a crack or a peel in the semiconductor device 100. In addition, by measuring the levels of voltage or current from the normal condition, the degree of a crack and peeling may also be predicted.

Figure 7:
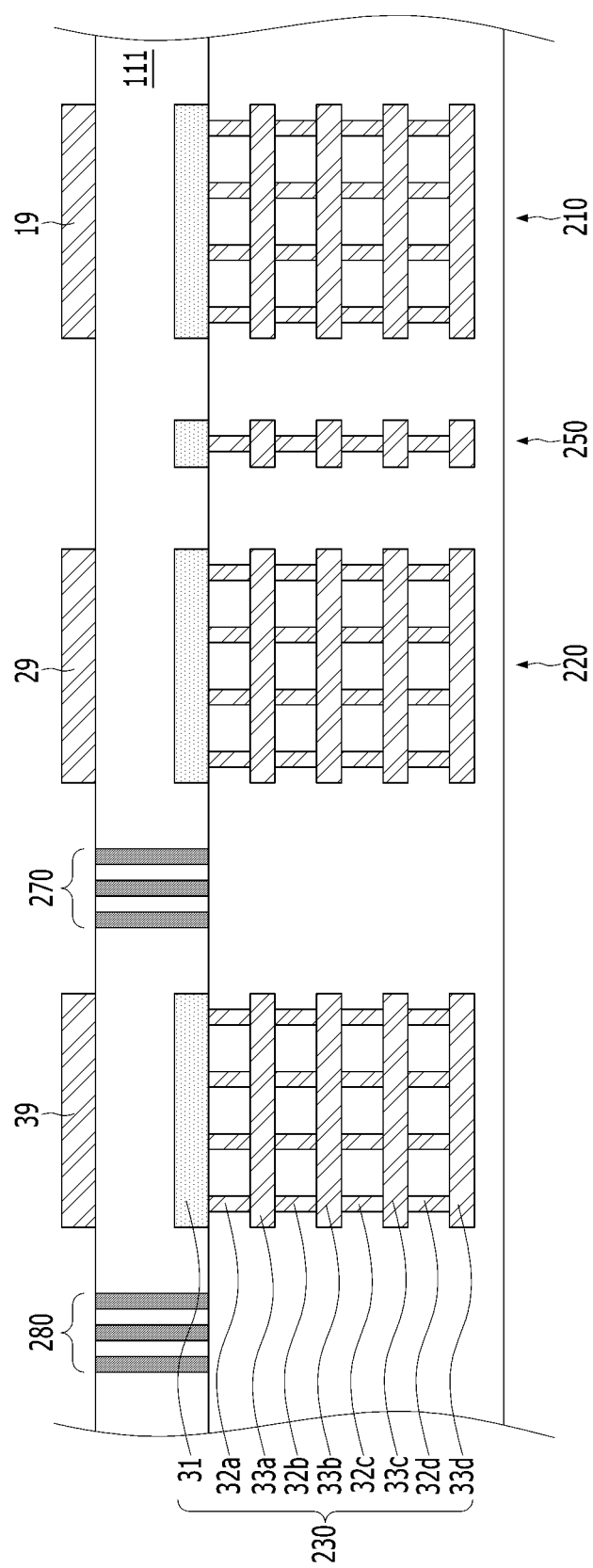
FIG. 7 is a longitudinal cross-sectional view taken along line V-V' of FIG. 2.

FIG. 7 is a longitudinal cross-sectional view taken along line V-V' of FIG. 2. Referring to FIG. 7, the seal-ring structure 200 of the semiconductor device 100 according to one embodiment of the present disclosure may include the inner seal-ring 210, the intermediate seal-ring 220, and the outer seal-ring 230, the crack detection ring 250, the inner trench ring 270, and the outer trench ring 280.

The intermediate seal-ring 220 and the outer seal-ring 230 may have the same vertical cross-sectional structure as the inner seal-ring 210. For example, the outer seal-ring 230 may include an outer doped region 31, outer via patterns 32a to 32d, and outer wiring patterns 33a to 33d. Further referring back to FIGS. 5A to 5E and FIG. 6, the fourth via patterns 22d and 32d, and the fourth wiring patterns 23d and 33d of the intermediate seal-ring 220 and the outer seal-ring 230 may be not omitted. Therefore, the semiconductor device 100 may further include an intermediate grid wiring 29 which is vertically aligned to the intermediate seal-ring 220, and may include an outer grid wiring 39 which is vertically aligned to the outer seal-ring 230.

The inner trench ring 270 and the outer trench ring 280 may each have a plurality of full deep trench isolation (FDTI) structures. The FDTI structure may include trenches, inside of which is filled with an insulating material, completely penetrating from a top to bottom surface of the upper substrate 111. The inner trench ring 270 and the outer trench ring 280 may absorb and block physical and chemical attack, e.g., propagation of cracks, applied to the upper substrate 111. Accordingly, the inner trench ring 270 and the outer trench ring 280 may prevent and mitigate cracking of the upper substrate 111.

Figure 8:
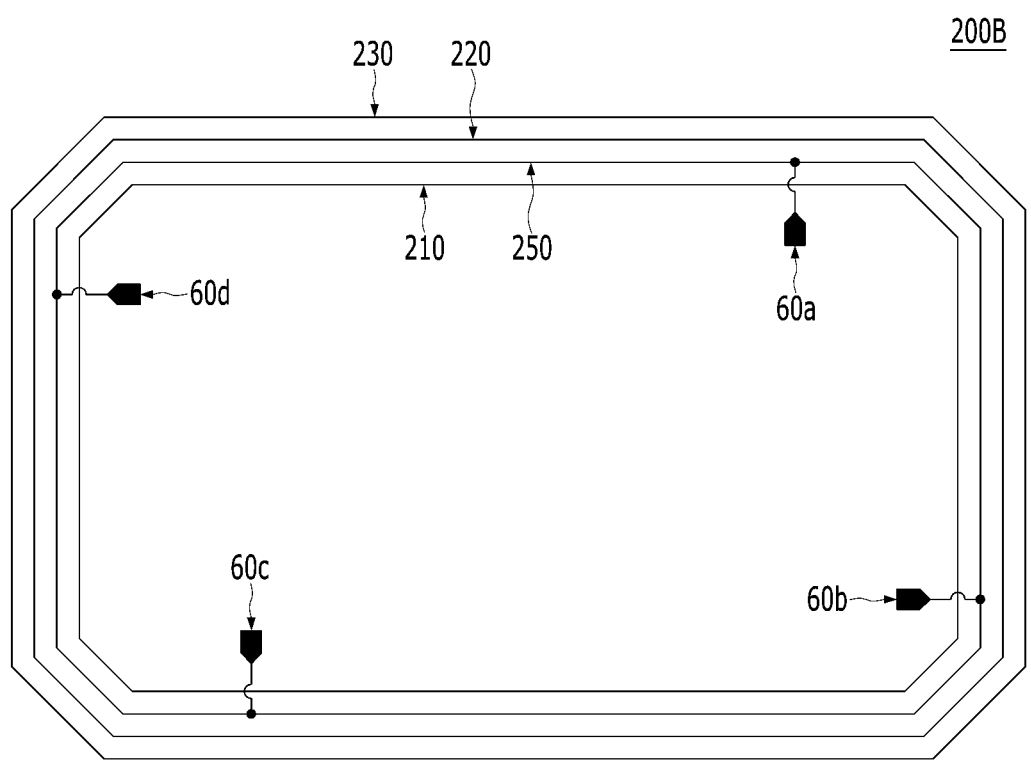
FIG. 8 is a top view illustrating an electrical connection of a seal-ring structure according to one embodiment of the present disclosure.

FIG. 8 is a top view showing the electrical connection of a seal-ring structure 200B according to one embodiment of the present disclosure. The inner trench ring 270 and the outer trench ring 280 of FIG. 2 have been omitted to better explain technical features of the present disclosure.

Referring to FIG. 8, the seal-ring structure 200B according to one embodiment of the present disclosure includes an inner seal-ring 210, an intermediate seal-ring 220, an outer seal-ring 230, and a crack detection ring 250, and a plurality of crack detection structures 60a to 60d. The crack detection ring 250 may have a closed loop structure. Referring to FIG. 2 and FIGS. 5A to 5E, the crack detection ring 250 and the inner seal-ring 210, or the crack detection ring 250 and the intermediate seal-ring 220 may be electrically connected. In another embodiment, the crack detection ring 250 and the inner seal-ring 210, or the crack detection ring 250 and the intermediate seal-ring 220 may not be electrically connected. For example, it is shown that the seal-ring structure 200B has first to fourth crack detection structures 60a to 60d connected to four sides (i.e., the upper side, the lower side, the left side, and the right side) of the crack detection ring 250, respectively. Each of the first to fourth crack detection structures 60a to 60d may independently provide voltage or current to the crack detection ring 250. Each of the first to fourth crack detection structures 60a to 60d may independently detect and measure voltage or current from the crack detection ring 250. In one embodiment, the first to fourth crack detection structures 60a to 60d may be spaced apart from each other at equal or otherwise predetermined intervals. The seal-ring structure 200B may selectively include two or more of the crack detection structures 60a to 60d. In another embodiment, the seal-ring structure 200B may include more crack detection structures than crack detection structures 60a to 60d shown in the drawing.

Figure 9:
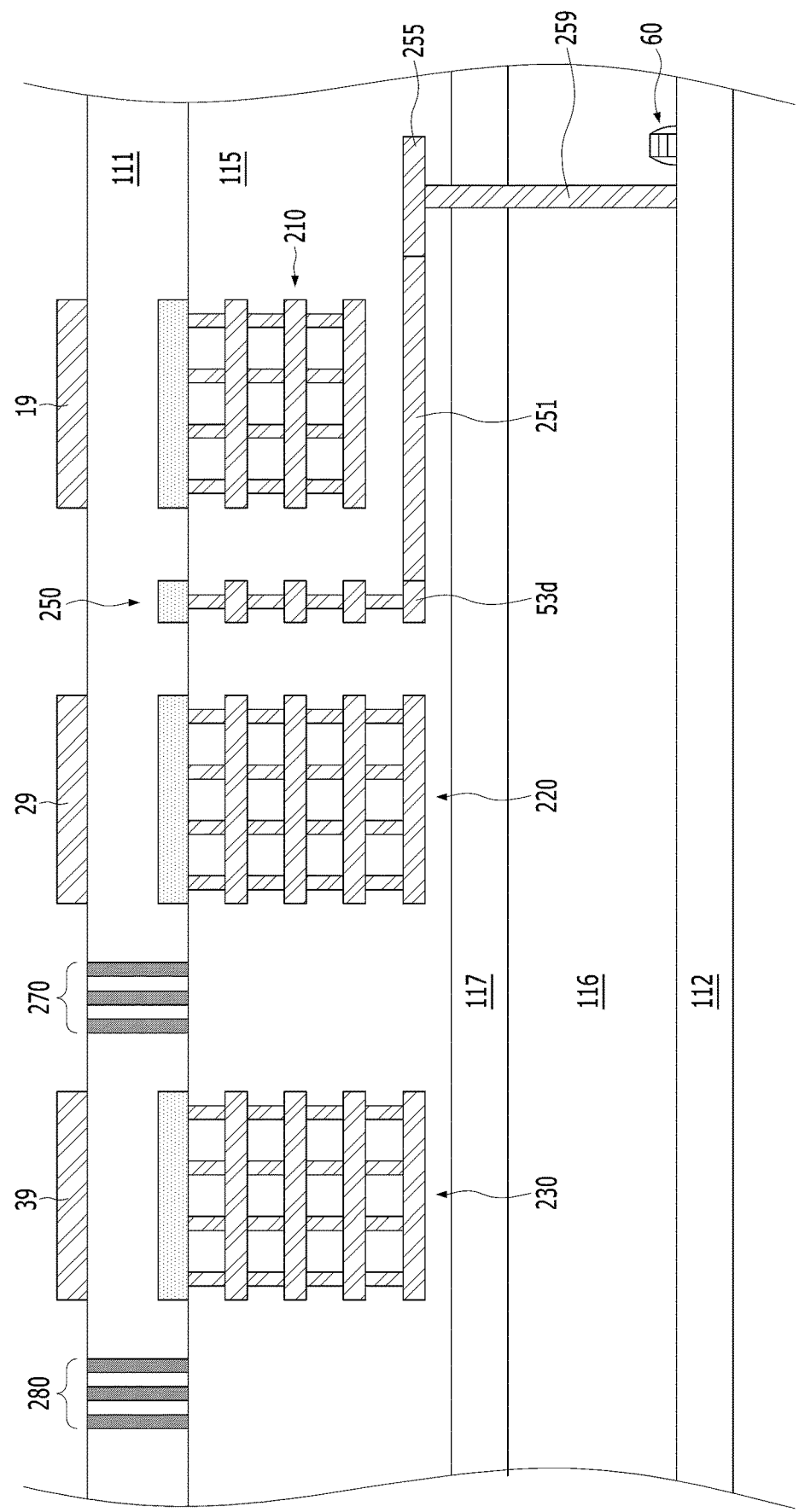
FIG. 9 is a longitudinal cross-sectional view illustrating a semiconductor device having the seal-ring structure of FIG. 8 according to one embodiment of the present disclosure.

FIG. 9 is a longitudinal cross-sectional view illustrating a semiconductor device 100 according to one embodiment of the present disclosure having the seal-ring structure 200B of FIG. 8. Referring to FIG. 9, the semiconductor device 100 according to this embodiment of the present disclosure may include an inner seal-ring 210, an intermediate seal-ring 220, an outer seal-ring 230, and a crack detection ring 250, inner and outer trench rings 270 and 280, and a crack detection structure 60. The crack detection structure 60 may be formed on a lower substrate 112. The crack detection structure 60 may include a control unit for providing voltage or an operation unit for detecting voltage. Accordingly, the crack detection structure 60 may include a plurality of transistors. In addition, the crack detection structure 60 may be electrically connected to the input pad 255 by a through via plug 259. The through via plug 259 may vertically penetrate a lower interlayer insulating layer 116 and a bonding insulating layer 117 to electrically connect the lower substrate 112 and the input pad 255. The lower substrate 112 may include a monocrystalline silicon layer. The lower interlayer insulating layer 116 may include an insulating material such as for example a silicon oxide or a silicon nitride. The bonding insulating layer 117 may include silicon oxide such as for example a high-density plasma oxide (HDP oxide).

With further reference to FIG. 8, a crack detection operation for detecting and estimating the crack location may include operating one of the first to fourth crack detection structures 60a to 60d in a voltage providing mode and operating three of the first to fourth crack detection structures 60a to 60d in an operation and measurement mode. For example, the crack detection operation may selectively perform a first crack detection operation, a second crack detection operation, a third crack detection operation, a fourth crack detection operation. The first crack detection operation uses the first crack detection structure 60a as a voltage provider and uses the second to fourth crack detection structures 60b to 60d as a voltage meter. The second crack detection operation uses the second crack detection structure 60b as a voltage provider and uses the first, third, and fourth crack detection structures 60a, 60c, and 60d as a voltage meter. The third crack detection operation uses the third crack detection structure 60c as a voltage provider and uses the first, second, and fourth crack detection structures 60a, 60b, and 60d as a voltage meter. The fourth third crack detection operation uses the fourth crack detection structure 60d as a voltage provider and uses the first to third crack detection structures 60a to 60c as a voltage meter. For example, in the operation and measurement mode, the first to fourth crack detection structures 60a to 60d may operate as comparators. Accordingly, the first to fourth crack detection structures 60a to 60d may have a voltage providing function and a voltage measuring function. For example, each of the first to fourth crack detection structures 60a to 60d may include a pull-up transistor for providing a voltage and a comparator for measuring a voltage. The crack detection operation may include at least two or more of the first to fourth crack detection operations. For example, the location of the crack may be detected or estimated by only two crack detection operations.

Figure 10:
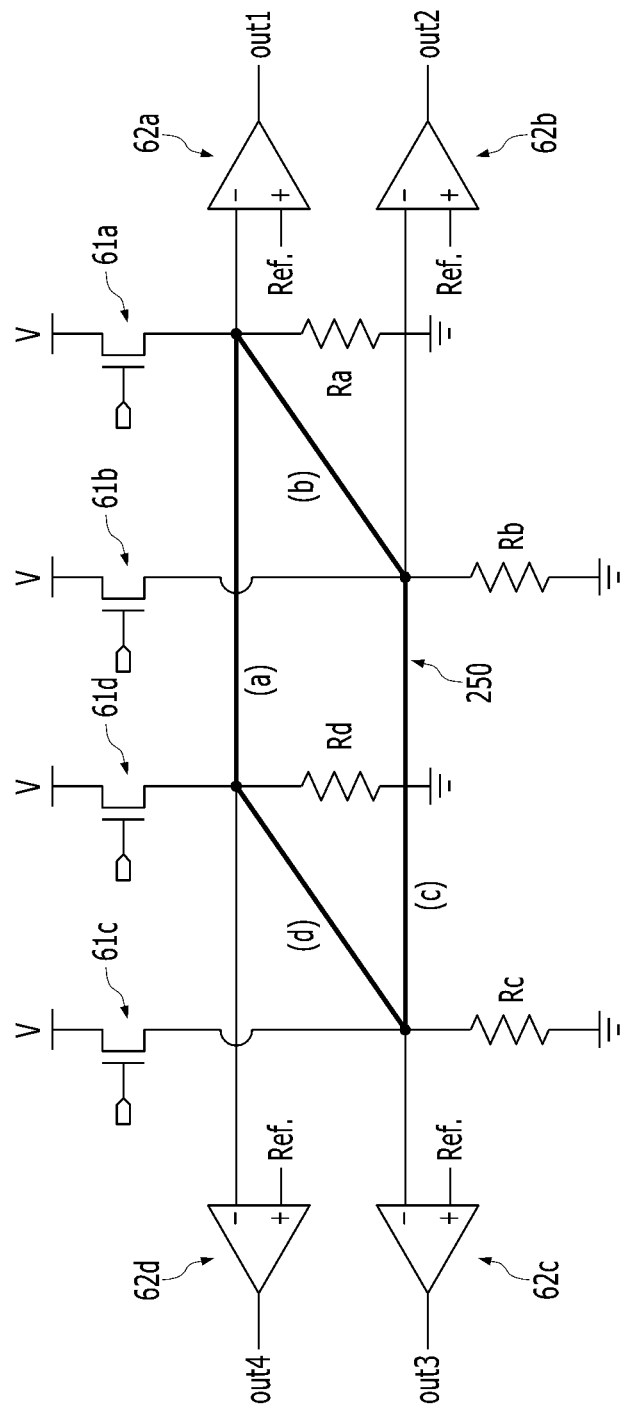
FIG. 10 is a three-dimensional circuit diagram conceptually illustrating the crack detection ring and crack detection structures of FIGS. 8 and 9.

FIG. 10 is a three-dimensional circuit diagram conceptually illustrating the crack detection ring 250 and the crack detection structures 60a to 60d of FIGS. 8 and 9. Referring to FIG. 10, the crack detection ring 250 may have a closed loop structure, and crack detection circuits 60a to 60d may be connected to four points of the crack detection ring 250, respectively. The first to fourth crack detection structures 60a to 60d of FIG. 8 may include respective control units 61a to 61d (i.e., that is respective controllers or control circuits) and respective operation units 62a to 62d (i.e., that is respective operators or operator circuits). As described above, the control units 61a to 61d may include a transistor connected to the power supply unit V to provide voltage or current to the crack detection ring 250. A pull-up transistor may include one or more of PMOS or NMOS. For example, it is assumed that each of the control units 61a to 61d includes one NMOS transistor. The operation units 62a to 62d may include comparators for detecting and measuring voltage or current from the crack detection ring 250. For example, each of the comparators may include a positive (+) input terminal receiving a reference voltage or a reference current, a negative (−) input terminal receiving a detection voltage or a detection current from the crack detection ring 250, and an output terminal. Accordingly, a difference between the reference voltage and the detection voltage received from the crack detection ring 250 or a difference between the reference current and the detection current received from the crack detection ring 250 may be output at the output terminal.

In addition, the first to fourth crack detection structures 60a to 60d may further include first to fourth load resistors Ra to Rd connected between the negative (−) input terminals of the comparator and the ground. The first to fourth load resistors Ra to Rd may have the same resistance value or otherwise known resistance values.

For example, the crack location may be estimated through the following operations.

Performing First Crack Detection Operation

The first control unit 61a: turn-on, the first operation unit 62a: turn-off

The second control unit 61b: turn-off, the second operation unit 62b: turn-on

The third control unit 61c: turn-off, the third operation unit 62c: turn-on

The fourth control unit 61d: turn-off, the fourth operation unit 62d: turn-on

Voltage or current may be provided to the crack detection ring 250 from the power supply unit V by turning-on the first control unit 61a. The voltage or the current passed through the crack detection ring 250 may be measured by turning on the second to fourth operation units 62b to 62d. By comparing measured values, the location of the crack may be estimated.

For example, if the voltage or current measured at the second operation unit 62b is higher than the voltage or current measured at the fourth operation unit 62d, it may be estimated that a crack has occurred in region (a) of the crack detection ring 250 disposed between the first crack detection structure (60a; 61a, 62a) and the fourth crack detection structure (60d; 61b, 62d) or in a region (c) of the crack detection ring 250 disposed between the second crack detection structure (60b; 61b, 62b) and the third crack detection structure (60c; 61c, 62c). If a crack has occurred in the region (a) of the crack detection ring 250, the voltage or current passed through the region (b) of the crack detection ring 250 will be measured at the second operation unit 62b and the voltage or current passed through regions (b), (c), and (d) of the crack detection ring 250 will be measured at the fourth operation unit 62d. Thus, the voltage or current measured at the fourth operation unit 62d may be lower than the voltage or current measured at the second operation unit 62b.

If a crack occurs in a region (c) of the crack detection ring 250, the second operation unit 62b will measure the voltage or current that has passed through the region (b) of the crack detection ring 250, and the voltage or current measured at the fourth operation unit 62d will be lower than the voltage or current measured at the second operation unit 62b because the fourth operation unit 62d needs to provide voltage or current toward the third operation unit 62c.

Performing Second Crack Detection Operation

The first control unit 61a: turn-off, the first operation unit 62a: turn-on

The second control unit 61b: turn-on, the second operation unit 62b: turn-off

The third control unit 61c: turn-off, the third operation unit 62c: turn-on

The fourth control unit 61d: turn-off, the fourth operation unit 62d: turn-on

The second control unit 61b may be turned on to provide voltage or current from the power supply unit V to the crack detection ring 250. The first, third, and fourth operation units 62a, 62c, and 62d may be turned on to measure the voltage or current that has passed through the crack detection ring 250. By comparing the measured values, the location of a crack may be more accurately estimated.

For example, if the voltage or current measured at the first operation unit 62a is higher than the voltage or current measured at the third operation unit 62c, it may be estimated that a crack has occurred in the region (a) of the crack detection ring 250 between the first crack detection structure (60a; 61a, 62a) and the fourth crack detection structure (60d; 61d, 62d). If a crack has occurred in the region (a) of the crack detection ring 250, the voltage or current that has passed through the area (b) of the crack detection ring 250 will be measured in the first operation unit 62a. Because the third operation unit 62c needs to provide voltage or current toward the fourth operation unit 62d, the voltage or current measured at the third operation unit 62c will be lower than the voltage or current measured at the first operation unit 62a.

Conversely, it may be estimated that a crack has occurred in the region (c) of the crack detection ring 250 between the second crack detection structure (60b; 61b, 62b) and the third crack detection structure (60c; 61c, 62c) if the voltage or current measured at the third operation unit 62c is higher than the voltage or current measured at the first operation unit 62a.

The crack location may be more accurately estimated by further performing the third and fourth crack detection operations. The crack location may be accurately estimated by this measurement principle. In particular, the size of a crack generated may be further estimated according to the voltage or current detected because a comparator is used in the technical feature of the present disclosure.

Figure 11:
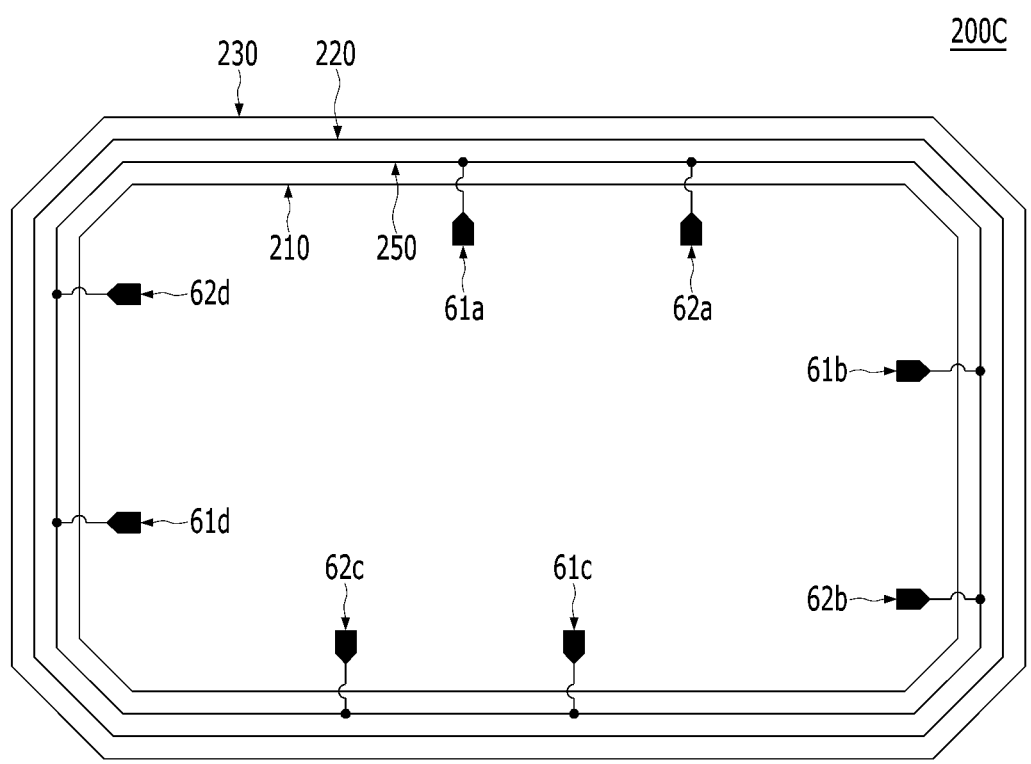
FIG. 11 is a top view illustrating an electrical connection of a seal-ring structure according to another embodiment of the present disclosure.

FIG. 11 is a top view illustrating the electrical connection of a seal-ring structure 200C according to another embodiment of the present disclosure. The inner trench ring 270 and the outer trench ring 280 of FIG. 2 have been omitted. Referring to FIG. 11, the seal-ring structure 200C according to this embodiment of the present disclosure may include an inner seal-ring 210, an intermediate seal-ring 220, an outer seal-ring 230, and a crack detection ring 250, and a plurality of crack detection structures 61a to 61d and 62a to 62d. For example, the plurality of crack detection structures 61a to 61d and 62a to 62d may include first to fourth control units 61a to 61d and first to fourth operation units 62a to 62d. In one embodiment, the first to fourth control units 61a to 61d and the first to fourth operation units 62a to 62d may be spaced apart from each other at equal intervals or at otherwise known intervals. Each of the first to fourth control units 61a to 61d may independently provide voltage or current to the crack detection ring 250 and may independently detect voltage or current from the crack detection ring 250. In another embodiment, the plurality of crack detection structures 61a to 61d and 62a to 62d may include at least four control units 61a to 61d and at least four operation units 62a to 62d.

Figure 12:
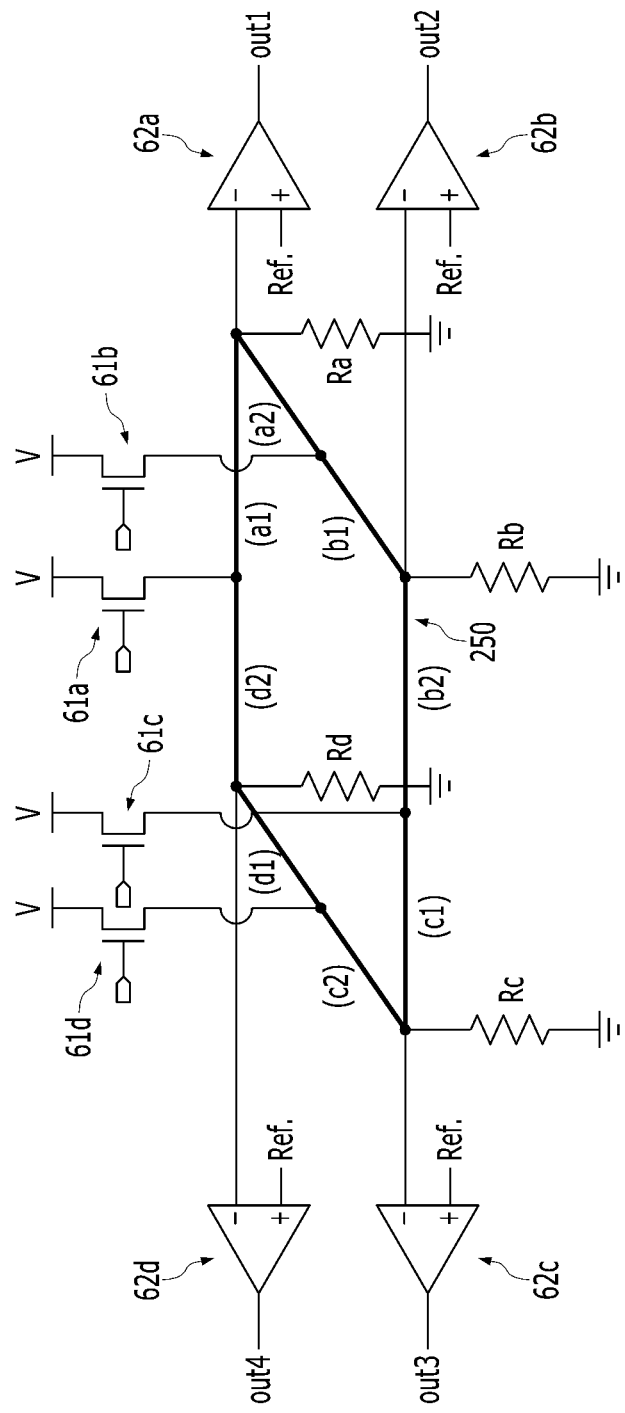
FIGS. 12 and 13 are three-dimensional circuit diagrams conceptually illustrating the crack detection ring and crack detection structures of FIG. 11, respectively.

FIG. 12 is a three-dimensional circuit diagram conceptually illustrating the crack detection ring 250 and the crack detection structures 61a to 61d and 62a to 62d of FIG. 11. Referring to FIG. 12, the crack detection ring 250 may have a closed loop structure. The first to fourth control units 61a to 61d and the first to fourth operation units 62a to 62d may be connected to multiple points of the crack detection ring 250, respectively. Connection points between the first to fourth control units 61a to 61d and the crack detection ring 250 and connection points between the first to fourth operation units 62a to 62d and the crack detection ring 250 may be alternately arranged at equal intervals. That is, in one embodiment, the distance between the connection points may be the same.

As described above, the control units 61a to 61d may provide voltage or current from the power supply unit V to the crack detection ring 250. For example, it is assumed that each of the control units 61a to 61d includes one NMOS transistor. In another embodiment, the control units 61a to 61d may include a PMOS transistor. The operation units 62a to 62d may include comparators for detecting and measuring voltage or current from the crack detection ring 250. For example, the comparators may include a positive (+) input terminal to which a reference voltage is input, a negative (−) input terminal to which a voltage is input from the crack detection ring 250, and output terminals out1 to out4 from which a compared value is output. In addition, the operation units 62a to 62d may further include the load resistors Ra to Rd connected to the crack detection ring 250 and the negative (−) input terminals. The load resistors Ra to Rd may have the same resistance value, and may be grounded.

The crack detection ring 250 illustrated in FIG. 12 may include eight divided regions a1, a2, b1, b2, c1, c2, d1, and d2 between the control units 61a to 61d and the operation units 62a to 62d. The crack detection operation may include selectively performing the first to fourth crack detection operations. For example, the first crack detection operation may include applying voltage or current to the crack detection ring 250 by turning on the first control unit 61a and turning off the second to fourth control units 61b to 61d and measuring the voltage or current by turning on the first to fourth operation units 62a to 62d. The second crack detection operation may include applying voltage or current to the crack detection ring 250 by turning on the second control unit 61b and turning off the first, third, and fourth control units 61a, 61c, and 61d and measuring the voltage or current by turning on the first to fourth operation units 62a to 62d.

The third crack detection operation may include applying voltage or current to the crack detection ring 250 by turning on the third control unit 61c and by turning off the first, second, and fourth control units 61a, 61b, and 61d and measuring the voltage or current by turning on the first to fourth operation units 62a to 62d. The fourth crack detection operation may include applying voltage or current to the crack detection ring 250 by turning on the fourth control unit 61d and turning off the first to third control units 61a to 61c and measuring the voltage or current by turning on the first to fourth operation units 62a to 62d. For example, a crack location may be detected or estimated performing the operations described below.

Performing First Crack Detection Operation

The first control unit 61a: turn-on

The second to the fourth control units 61b to 61d: turn-off

The first to fourth operation units 62a to 62d: turn-on

If the voltage or current measured at the first operation unit 62a is greater than the voltage or current measured at the fourth operation unit 62d, it may be estimated that a crack has occurred in a region (a2), region (b1), or region (d2) of the crack detection ring 250. Alternatively, if the voltage or current measured at the first operation unit 62a is lower than the voltage or current measured at the fourth operation unit 62d, it may be estimated that a crack has occurred in a region (a1), region (c2), or region (d1).

Performing Second Crack Detection Operation

The second control unit 61b: turn-on

The first, third, and fourth control units 61a, 61c, and 61d: turn-off

The first to fourth operation units 62a to 62d: turn-on

If the voltage or current measured at the first operation unit 62a is greater than the voltage or current measured at the fourth operation unit 62d in the first crack detection operation and the voltage or current measured at the first operation unit 62a is greater than the voltage or current measured at the second operation unit 62b in the second crack detection operation, it may be estimated that a crack has occurred in the region (b1) or region (d2) of the crack detection ring 250. In other words, it may be estimated that no crack has occurred in the region (a). Alternately, if the voltage or current measured at the first operation unit 62a is greater than the voltage or current measured at the fourth operation unit 62d in the first crack detection operation, and the voltage or current measured at the first operation unit 62a is lower than the voltage or current measured at the second operation unit 62b, it may be estimated that a crack has occurred in the region (a2) of the crack detection ring 250.

Performing Third Crack Detection Operation

The third control unit 61c: turn-on

The first, second, and fourth control units 61a, 61b, and 61d: turn-off

The first to fourth operation units 62a to 62d: turn-on

If the voltage or current measured at the first operation unit 62a is greater than the voltage or current measured at the fourth operation unit 62d in the first crack detection operation, the voltage or current measured at the first operation unit 62a greater than the voltage or current measured at the second operation 62b in the second crack detection operation, and the voltage or current measured in the second operation unit 62b is greater than the voltage or current measured at the third operation unit 62c in the third crack detection operation, it may be estimated that a crack has occurred in the region (b1) of the crack detection ring.

Alternatively, after performing the second crack detection operation, the third crack detection operation may be omitted and the fourth crack detection operation may be performed.

Performing Fourth Crack Detection Operation

The fourth control unit 61d: turn-on

The first to third control units 61a to 61c: turn-off

The first to fourth operation units 62a to 62d: turn-on

If the voltage or current measured at the first operation unit 62a is greater than the voltage or current measured at the fourth operation unit 62d in the first crack detection operation, the voltage and current measured at the first operation unit 62a is greater than the voltage or current measured at the second operation unit 62b in the second crack detection operation, and the voltage or current measured at the third operation unit 62c is lower than the voltage or current measured at the fourth operation unit 62d, it may be estimated that a crack has occurred in the region (d2) of the crack detection ring.

Even when a crack occurs in multiple locations, an accurate crack location may be estimated by comparing the voltages or currents measured at the first to fourth operation units 62a to 62d according to the crack detection operations described above.

Figure 13:
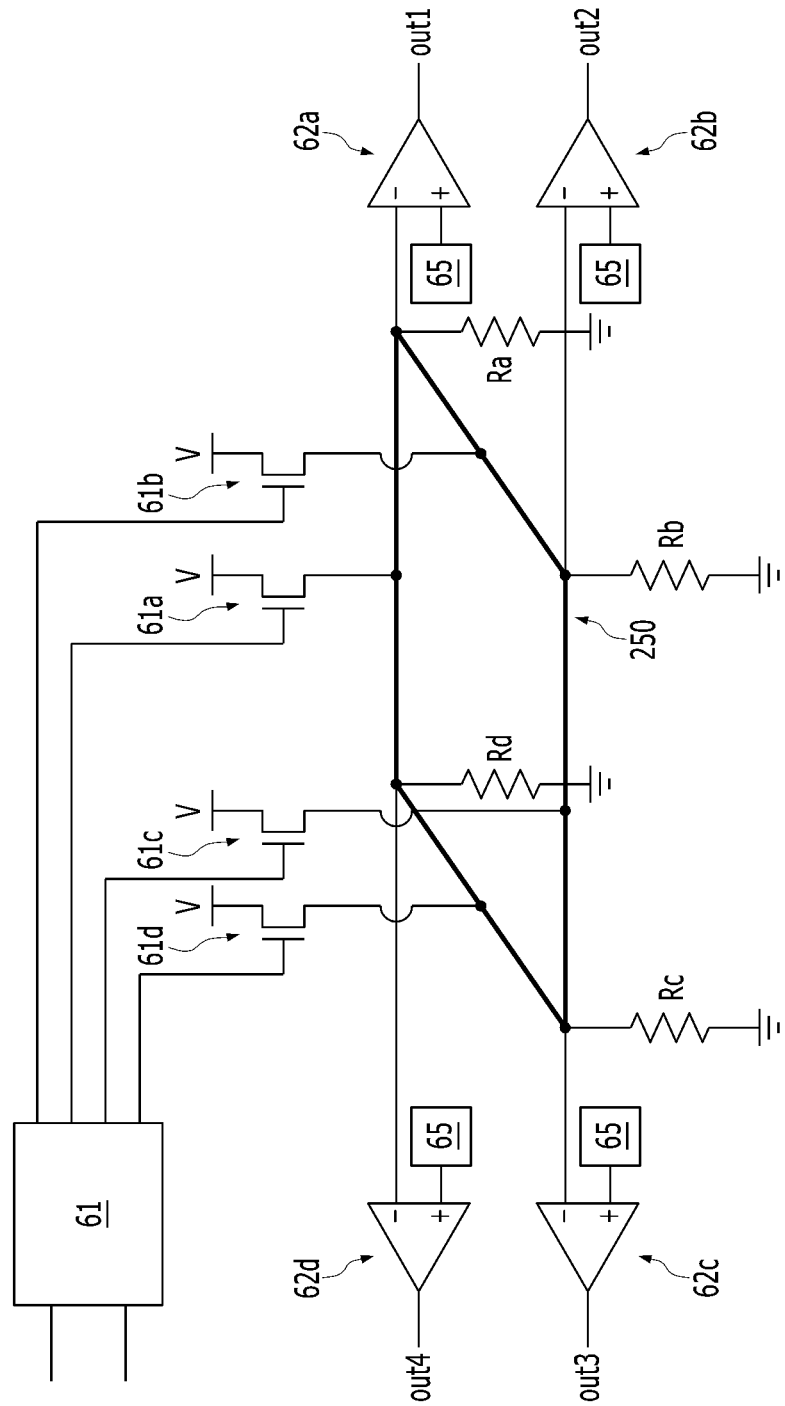

FIG. 13 is a three-dimensional circuit diagram conceptually illustrating the crack detection ring 250 and the crack detection structures 61a to 61d and 62a to 62d of FIG. 11. Referring to FIG. 13, the semiconductor device 100 may further include a decoding unit 61 for controlling the first to fourth control units 61a to 61d and selectors 65 for providing reference voltage to the positive (+) input terminal of the first to fourth operation units 62a to 62d. The decoding unit 61 may independently turn on and turn off each of the four control units 61a to 61d by receiving a control signal of two bits. The decoding unit may reduce the number of routing wires for independently controlling the control units 61a to 61d. The selectors 65 may variously adjust the levels of the reference voltage provided to the operation units 62a to 62d, for example, the positive (+) input terminals of the comparators.

Figure 14:
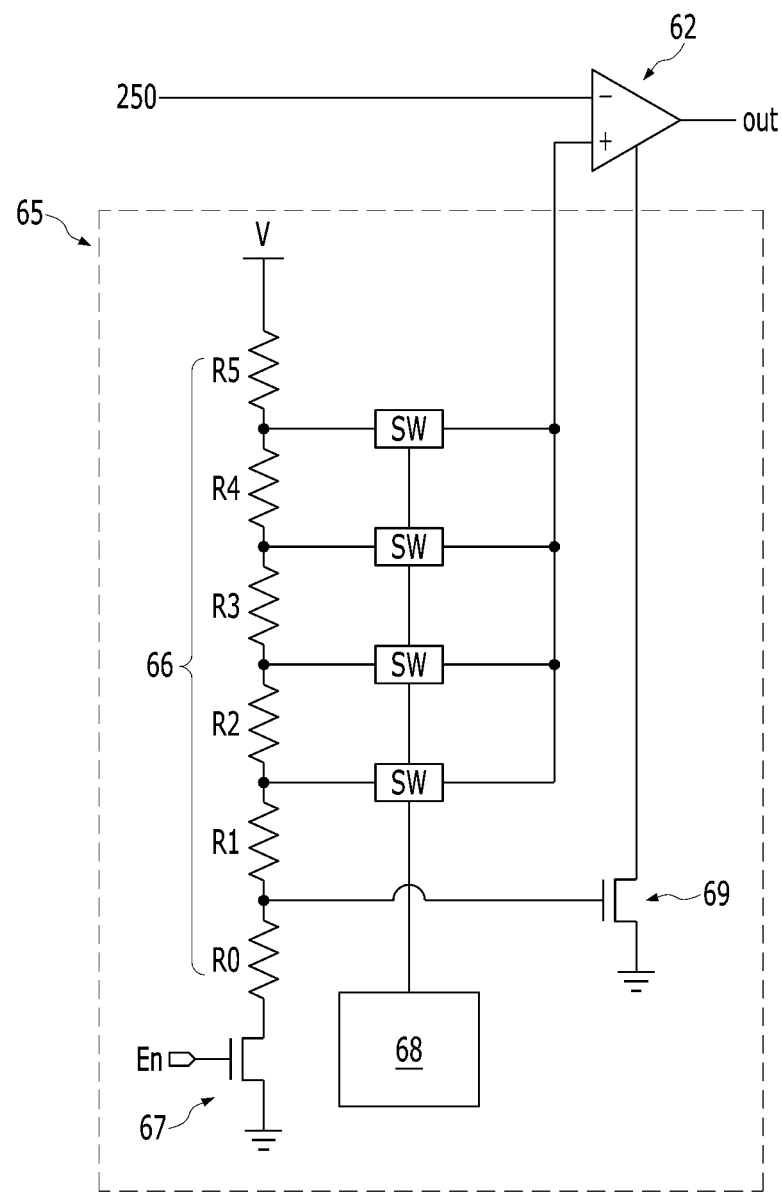
FIG. 14 is a circuit diagram illustrating selectors of FIG. 13.

FIG. 14 is a circuit diagram conceptually illustrating the selectors 65 of FIG. 13. Referring to FIG. 14, the selector 65 may include a resistance string 66 and an active transistor 67, switches SW and a switch controller 68, and a self-bias transistor 69. The resistance string 66 and the active transistor 67 may be connected in series between the power supply unit V and the ground. The resistance string 66 may include a plurality of resistance elements R0 to R5. The resistance string 66 may divide the power supply voltage into a plurality of levels. The active transistor 67 may be turned on to activate the selector 65. For example, when the active transistor 67 is turned on, voltage or current may be provided to the resistance elements R0 to R5 of the resistance string 66, and nodes between the resistance elements R0 to R5 may have multiple voltage levels. The switches SW may be connected to the nodes between the resistance elements R0 to R5 of the resistance string 66, respectively. The switch controller 68 may selectively turn on the switches SW. Accordingly, various voltage levels of the nodes between the resistance elements R0 to R5 of the resistance strings 66 may be selectively provided to the positive (+) input terminal of the operation unit 62. The switch controller 68 may also perform a decoding operation. Accordingly, the number of wiring routings for turning on the switches SW may be minimized. The gate electrode of the self-bias transistor 69 may be electrically connected to one of the nodes between the resistance elements R0-R5 of the resistance string 66. For example, gate electrode of the self-bias transistor 69 may be connected to a node between the base resistance element R0 and the first resistance element R1. A first source/drain electrode of the self-bias transistor 69 may be connected to the current source node of the operation unit 62, and a second source/drain electrode of the self-bias transistor 69 may be grounded. Accordingly, reference voltage of various levels may be input to the positive (+) input terminal of the operation unit 62, and an output of the operation unit 62 may have one of a plurality of voltage levels. That is, the operation unit 62 according to the present disclosure may perform an analog operation.

Although the present invention has been specifically described according to the above-described preferred embodiments, it should be noted that the above-described embodiments are for the purpose of explanation and not for the limitation thereof. In addition, it will be appreciated by person having ordinary skill in the art that various embodiments are possible within the scope of the present invention.

What is claimed is:

1. A semiconductor device, comprising:
an upper substrate having a circuit region;
a first seal-ring surrounding the circuit region over the upper substrate;
a crack detection ring surrounding the first seal-ring over the upper substrate;
a second seal-ring surrounding the first seal-ring and the crack detection ring over the upper substrate;
a connection part connecting the first seal-ring and the crack detection ring;
a crack detection structure disposed in the circuit region and electrically connected to the crack detection ring;
a third seal-ring surrounding the second seal-ring over the upper substrate; and
a first trench ring disposed between the second seal-ring and the third seal-ring,
wherein the first trench ring has a trench isolation structure formed inside the upper substrate, and
wherein the trench isolation structure includes an insulating material filled in a trench.

2. The semiconductor device of claim 1,
wherein the crack detection ring includes:
a crack detection doped region formed in the upper substrate;
a multilayer of crack detection pad patterns formed on a first surface of the upper substrate; and
a multilayer of crack detection via patterns electrically connecting the crack detection doped region and the crack detection pad patterns,
wherein the crack detection doped region horizontally and electrically connects two crack detection via patterns adjacent to each other among the crack detection via patterns, and
wherein one of the crack detection pad patterns, which is spaced apart farthest from the upper substrate, horizontally and electrically connects two crack detection via patterns adjacent to each other among the crack detection via patterns.

3. The semiconductor device of claim 2,
further including an input pad and an extension part for providing voltage or current to the crack detection ring,
wherein the input pad is disposed in the circuit region,
wherein the extension part crosses the first seal-ring and connects the crack detection ring and the input pad, and
wherein the extension part is insulated from the first seal-ring.

4. The semiconductor device of claim 2,
wherein the crack detection structure includes a control unit and an operation unit,
wherein the control unit provides voltage or current to the crack detection ring, and
wherein the operation unit detects the voltage or current from the crack detection ring.

5. The semiconductor device of claim 4,
wherein the crack detection structure includes a plurality of control units and a plurality of operation units, and
wherein the plurality of control units and the plurality operation units are commonly and alternately disposed to be connected to the same crack detection ring.

6. The semiconductor device of claim 5,
wherein nodes between the control units and the crack detection ring, and nodes between the operation units and the crack detection rings are alternately disposed at an equal interval.

7. The semiconductor device of claim 4,
wherein the operation unit includes a comparator including:
a first input terminal receiving a reference voltage or a reference current;
a second input terminal receiving the detection voltage or the detection current from the crack detection ring; and
an output terminal outputting a difference between the reference voltage and the detection voltage or a difference between the reference current and the detection current.

8. The semiconductor device of claim 7,
wherein the crack detection structure further includes a load resistance connected between the second input terminal and a ground.

9. The semiconductor device of claim 7,
wherein the crack detection structure further includes a selector connected to the first input terminal of the comparator, and
wherein the selector includes a resistance string that divides the reference voltage or the reference current into multiple levels and a plurality of switches that inputs one level among the multiple levels of the divided voltage or the divided current to the first input terminal.

10. The semiconductor device of claim 9,
wherein the selector further includes an active transistor and a self-bias transistor,
wherein the active transistor is connected in series with the resistance string, and
wherein the self-bias transistor includes a gate electrode connected to one of the nodes between a plurality of resistors in the resistance string, a drain electrode connected to a current source node of the comparator, and a grounded source electrode.

11. The semiconductor device of claim 2,
wherein the first seal-ring includes:
a first doped region formed inside the upper substrate;
a multilayer of first wiring patterns formed on the first surface of the upper substrate; and
a multilayer of first via patterns electrically connecting the first doped region and the first wiring patterns.

12. The semiconductor device of claim 11,
wherein the second seal-ring includes:
a second doped region formed inside the upper substrate; and
a multilayer of second wiring patterns formed on the first surface of the upper substrate;

a multilayer of second via patterns electrically connecting the second doped region and the second wiring patterns.

13. The semiconductor device of claim 12,
wherein the first wiring patterns and the second wiring patterns extend parallel to each other in a horizontal direction,
wherein the first via patterns and the second via patterns extend parallel to each other in a vertical direction, and
wherein the first seal-ring and the second seal-ring have a vertical cross-section of a mesh shape.

14. The semiconductor device of claim 12,
further including a first grid wiring and a second grid wiring disposed on a second surface of the upper substrate,
wherein the first grid wiring is vertically spaced apart from the first seal-ring not to be electrically connected to the first seal-ring,
wherein the first grid wiring is parallel to the first seal-ring,
wherein the second grid wiring is vertically spaced apart from the second seal-ring not to be electrically connected to the second seal-ring, and
wherein the second grid wiring is parallel to the second seal-ring.

15. The semiconductor device of claim 1, further including:
a second trench ring disposed outside the third seal-ring,
wherein the second trench ring has a trench isolation structure formed inside the upper substrate.

16. A semiconductor device, comprising:
a first seal-ring surrounding a circuit region;
a crack detection ring surrounding the first seal-ring;
a second seal-ring surrounding the first seal-ring and the crack detection ring; and
a plurality of controllers and a plurality of operators disposed inside the circuit region and electrically connected to the crack detection ring,
wherein the plurality of controllers and the plurality of operators are alternately disposed to be commonly connected to the same crack detection ring, and
wherein the plurality of controllers provides a current or a voltage to the crack detection ring and the plurality of operators includes a comparator that compares the current or the voltage, which passed through the crack detection ring, with a reference current or a reference voltage, respectively.

17. The semiconductor device of claim 16, further including a connection part electrically connecting the first seal-ring and the crack detection ring.

18. The semiconductor device of claim 16,
wherein nodes between the plurality of controllers and the crack detection ring and nodes between the plurality of operators and the crack detection ring are alternately disposed at an equal interval.

19. The semiconductor device of claim 16,
wherein the first seal-ring includes:
a first doped region formed inside an upper substrate; and
a multilayer of first wiring patterns and a plurality of first via patterns formed inside an upper interlayer insulating layer on the upper substrate,
wherein the first doped region and the first wiring patterns extend parallel to each other in a horizontal direction,
wherein the second seal-ring includes:
a second doped region formed inside the upper substrate; and
a multilayer of second wiring patterns and a plurality of second via patterns formed inside the upper interlayer insulating layer,
wherein the second doped region and the second wiring patterns extend parallel to each other in a horizontal direction, and
wherein the crack detection ring includes:
a crack detection doped region formed inside the upper substrate; and
a multilayer of crack detection pad patterns and a plurality of crack detection via patterns formed inside the upper interlayer insulating layer,
wherein the plurality of controllers and the plurality of operators are formed on a lower substrate.

20. A semiconductor device, comprising:
a first seal-ring surrounding a circuit region;
a crack detection ring surrounding the first seal-ring;
a second seal-ring surrounding the first seal-ring and the crack detection ring;
a connection part connecting the first seal-ring and the crack detection ring;
a crack detection structure disposed in the circuit region and electrically connected to the crack detection ring,
an upper interlayer insulating layer formed on the first surface of the upper substrate and surrounding the first seal-ring, the second seal-ring, and the crack detection ring;
a bonding insulating layer on a surface of the upper interlayer insulating layer;
a lower interlayer insulating layer on a surface of the bonding insulating layer; and
a lower substrate on a surface of the lower interlayer insulating layer,
wherein the crack detection structure includes a control unit and an operation unit,
wherein the control unit provides voltage or current to the crack detection ring,
wherein the operation unit detects the voltage or current from the crack detection ring, and
wherein the control unit and the operation unit are disposed on the lower substrate.

* * * * *